United States Patent [19]
Nakao et al.

[11] Patent Number: 6,008,477
[45] Date of Patent: Dec. 28, 1999

[54] HEAT TREATMENT APPARATUS

[75] Inventors: Ken Nakao; Makoto Kobayashi; Hisaei Osanai, all of Sagamihara, Japan

[73] Assignee: Tokyo Electron Limited, Japan

[21] Appl. No.: 09/023,769

[22] Filed: Feb. 13, 1998

[30] Foreign Application Priority Data

Feb. 18, 1997 [JP] Japan .................................. 9-049774

[51] Int. Cl.⁶ .................................. F27B 5/14; H05B 3/66
[52] U.S. Cl. .......................... 219/390; 219/407; 373/127; 373/130
[58] Field of Search ..................................... 219/389, 390, 219/391, 393, 395, 396, 402, 403, 406, 407, 408; 373/111, 112, 110, 118, 119, 127, 128, 130, 131

[56] References Cited

FOREIGN PATENT DOCUMENTS

| | | |
|---|---|---|
| 62-170186 | 7/1987 | Japan . |
| 2-154420 | 6/1990 | Japan . |
| 4-10199 | 2/1992 | Japan . |
| 6-32269 | 4/1994 | Japan . |
| 70-58046 | 3/1995 | Japan . |
| 8-64546 | 3/1996 | Japan . |

*Primary Examiner*—Tu Ba Hoang
*Attorney, Agent, or Firm*—Smith, Gambrell & Russell, LLP

[57] ABSTRACT

A helical heating wire is disposed so as to surround a reaction tube, and is held by a heat insulating structure. Support members are arranged at predetermined pitches on the inner circumference of the heat insulating structure to support the heating wire on the inner circumference of the heat insulating structure so as to enable the heating wire to make thermal expansion and thermal contraction. Fixing means are attached to one loop out of every suitable number of loops of the helical heating wire to fix the heating wire to the heat insulating structure.

20 Claims, 7 Drawing Sheets

HEAT TREATMENT APPARATUS

TECHNICAL FIELD

The present invention relates to a heat treatment apparatus for heat-treating workpieces, such as semiconductor wafers.

BACKGROUND ART

Various heat treatment apparatuses are used in, for example, fabricating a semiconductor device to subject a semiconductor wafer, i.e., a workpiece, to an oxidation process, a diffusion process, a CVD (chemical vapor deposition) process and the like. A generally known heat treatment apparatus comprises a reaction tube (process tube) defining a processing chamber for containing a semiconductor wafer for processing, a resistance heating device disposed so as to surround the reaction tube, and a heat insulating structure disposed so as to surround the resistance heating device, and the resistance heating device is supported on the inner surface of the heat insulating structure by supporting members.

A resistance heating device, for example, for a heat treatment apparatus capable of carrying out a batch process employs a heating wire wound in a helical coil and disposed on the inner surface of a cylindrical heat insulating structure and is capable of heating the interior of a furnace at a high temperature of, for example, about 1200° C. The heat insulating structure is, for example, is made by winding a heat insulating material, such as ceramic fibers, in a cylinder, and burning the cylinder. The heat insulating structure reduces the quantity of heat dissipated by radiation and conduction to enhance heating efficiency. The support members are made of, for example, a ceramic material and are disposed at predetermined intervals to support the heating wire so as to allow the thermal expansion and thermal contraction of the heating wire.

Incidentally, in the foregoing heat treatment apparatus, the heating wire is wound in a helical coil and is supported with a clearance between the heating wire and the heat insulating structure so as to be able to make thermal expansion and thermal contraction. However, the heating wire is subject to creep strain because the same is used at a high temperature, and the length of the heating wire increases with time. When energized for heating, the heating wire makes thermal expansion. The elongation of the heating wire appears at one end of the heating wire, the diameter of a coil of the heating wire at one end of the heating wire increases and the coil comes into contact with the heat insulating structure, a portion of the heating wire in contact with the heat insulating structure and portions of the same around the portion in contact with the heat insulating structure are subject to buckling deformation and are liable to be broken, which reduces the durability of the hating wire.

Particularly, in a vertical heat treatment apparatus, a heating wire is divided into a plurality of sections corresponding respectively to a plurality of zones, and the sections of the heating wire are fixed to a heat insulating structure by terminal strips. Therefore, elongations in the sections of the heating wire resulting from creep or thermal expansion are concentrated on the lowermost coils of the sections of the heating wire, and the lowermost coils of the sections of the heating wire come into contact with the heat insulating structure and become unable to absorb the elongations. Consequently, buckling deformation or the like of the heating wire occurs, the heating wire is liable to brake and the durability of the heating wire is deteriorated.

DISCLOSURE OF THE INVENTION

Accordingly, it is an object of the present invention to provide a heat treating apparatus provided with a heating wire capable of preventing the accumulation of an elongation due to creep and thermal expansion in one end thereof and having improved durability.

With the foregoing object in view, according to one aspect of the present invention, a heat treatment apparatus comprises a cylindrical reaction tube disposed in a vertical position, a heat insulating structure disposed so as to surround the reaction tube, a heating wire wound in a helical coil and disposed on the inner surface of the heat insulating structure, and support members held on the heat insulating structure and supporting the heating wire so as to enable the heating wire to make thermal expansion and thermal contraction, wherein the heating wire is provided with a plurality of fixing means, and the fixing means are embedded in the heat insulating structure so as to prevent the heating wire from circumferential movement.

According to another aspect of the present invention, a heat treatment apparatus comprises a cylindrical reaction tube disposed in a vertical position, a heat insulating structure disposed so as to surround the reaction tube, a heating wire wound in a helical coil and disposed on the inner surface of the heat insulating structure, and support members held on the heat insulating structure and supporting the heating wire so as to enable the heating wire to make thermal expansion and thermal contraction, wherein the heating wire is provided with a plurality of fixing means, and the fixing means are connected to the support members so as to prevent the heating wire from circumferential movement.

BEST MODE FOR CARRYING OUT THE INVENTION

First Embodiment

Figure 1:
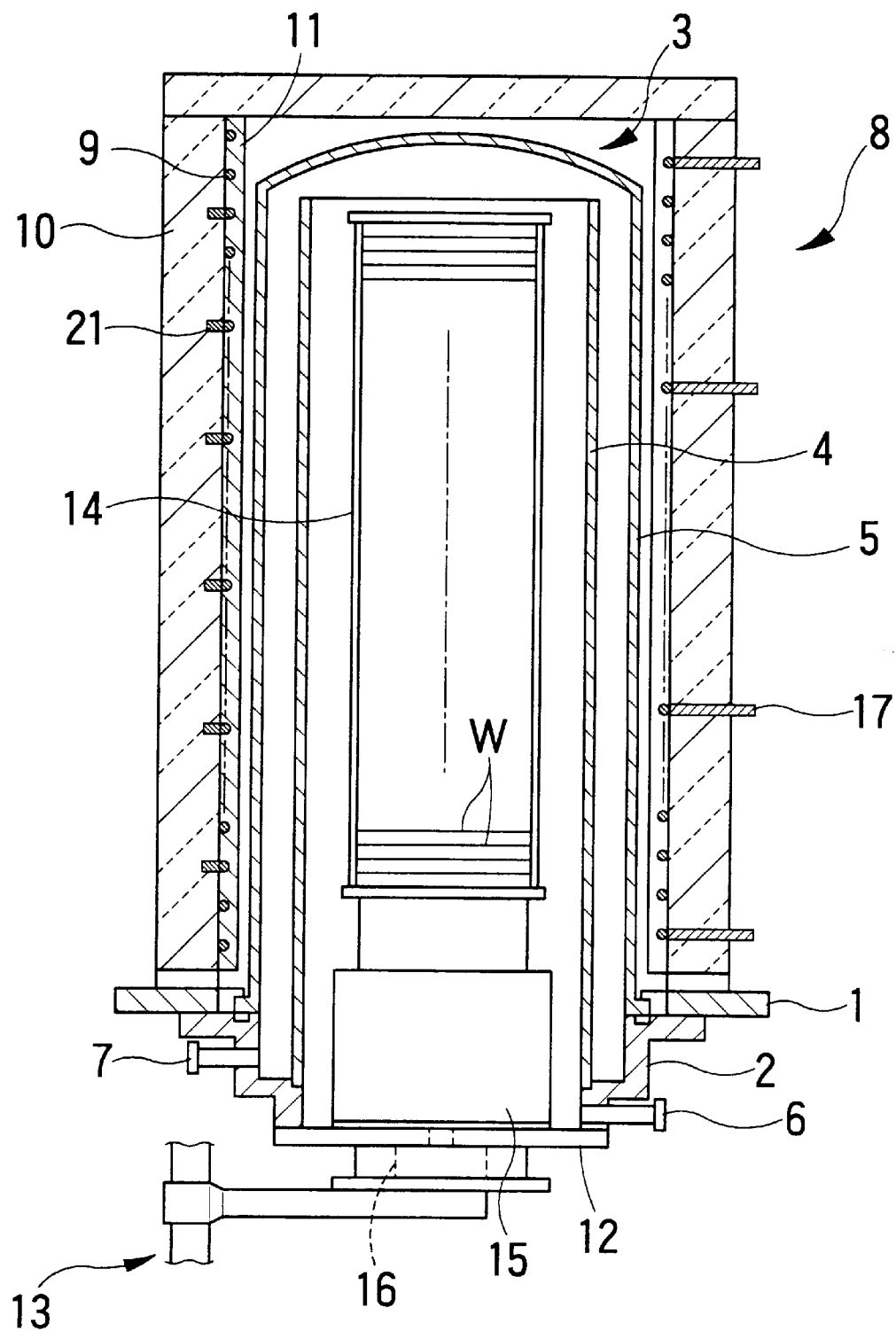
FIG. 1 is a longitudinal sectional view of a vertical heat treatment apparatus in a first embodiment according to the present invention.
Figure 2:
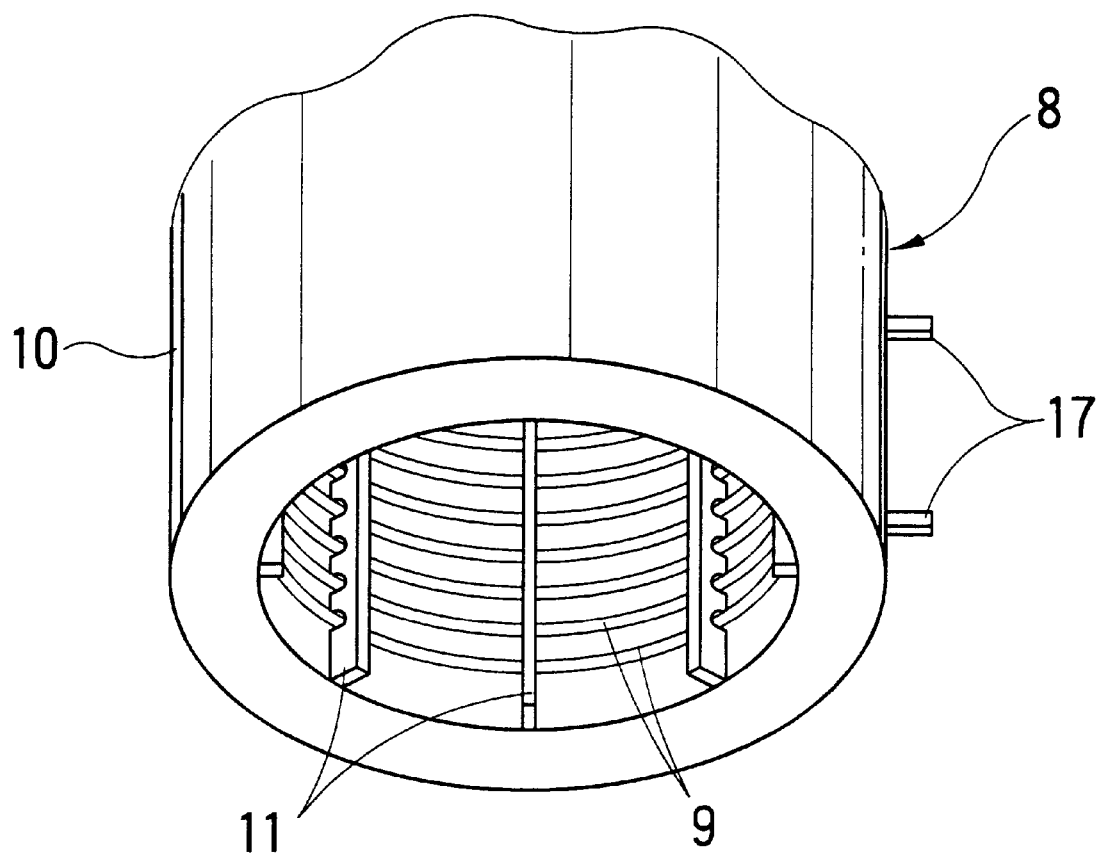
FIG. 2 is a fragmentary perspective view of a heater included in the vertical heat treatment apparatus taken from below the heater.
Figure 3:
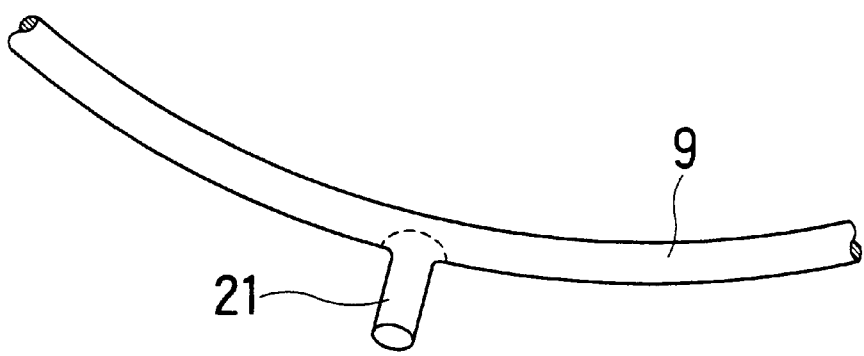
FIG. 3 is a perspective view of a fixing part formed on a heating wire.
Figure 4A:
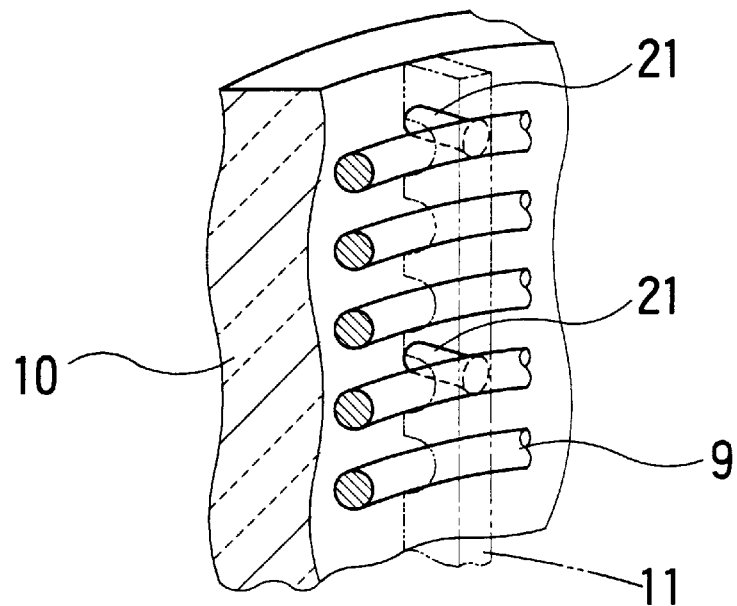
FIG. 4A is a fragmentary perspective view of the heater.
Figure 4B:
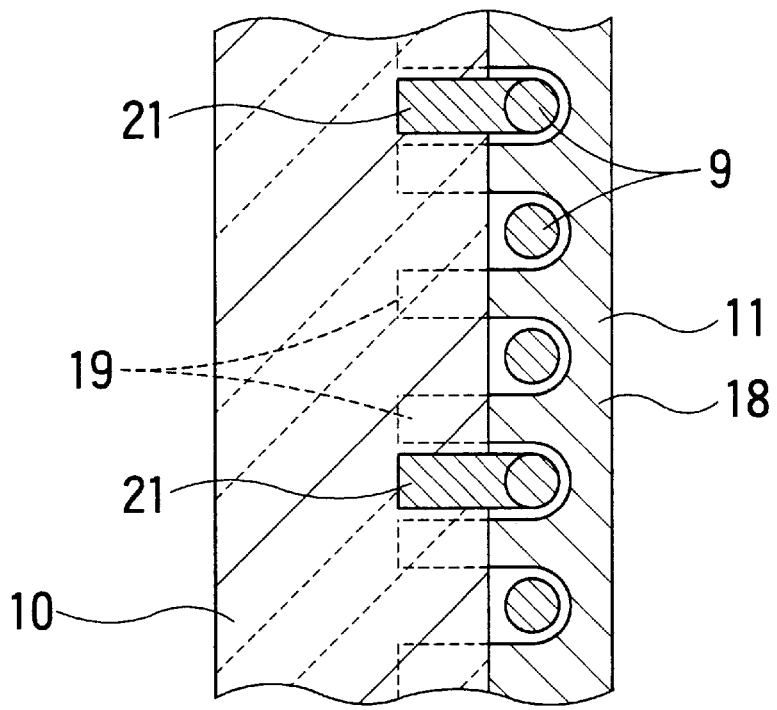
FIG. 4B is a fragmentary sectional view of the heater.

A first embodiment of the present invention will be described hereinafter with reference to the accompanying drawings. FIG. 1 is a longitudinal sectional view of a vertical heat treatment apparatus in a first embodiment according to the present invention, FIG. 2 is a fragmentary perspective view of a heater included in the vertical heat treatment apparatus taken from below the heater, FIG. 3 is a perspective view of a fixing part formed on a heating wire, FIG. 4A is a fragmentary perspective view of the heater, and FIG. 4B is a fragmentary sectional view of the heater. The vertical heat treatment apparatus shown in FIG. 1 by way of example is constructed so as to be suitable for subjecting a semiconductor wafer W, i.e., a workpiece, to a film forming process using vacuum CVD. The vertical heat treatment apparatus has a base plate 1 of, for example, a stainless steel to mount a heat treatment furnace thereon. The base plate 1 is provided with an opening to pass a reaction tube 3, which will be described later, therethrough.

A short, cylindrical manifold 2 made of a heat-resistant metal, such as a stainless steel, is detachably joined to the lower surface of the base plate 1 coaxially with the opening of the base plate 1 with bolts. A cylindrical reaction tube (process tube) 3 made of a heat-resistant material, such as quartz, and defining a processing chamber is attached in an upright position to the manifold 2.

Preferably, the reaction tube 3 is a double-wall tube consisting of an inner tube 4 and an outer tube 5. The outer tube 5 serving substantially as the reaction tube 3 has a closed upper end and an open lower end hermetically connected to the upper open end of the manifold 2. The inner tube 4 has open opposite ends, and the open lower end of the inner tube 4 is seated on a step formed in the inner circumference of the manifold 2.

The manifold 2 is provided with an inlet port 6 for supplying a process gas from a gas source, not shown, into the reaction tube 3, and an outlet port 7 for evacuating the interior of the reaction tube 3 to a vacuum in the range of, for example, about 10 to about $10^{-8}$ torr by a pressure reducing means, not shown. A process gas is supplied into the inner tube 4 through the inlet port 6. An exhaust gas produced by processing is discharged through an annular passage formed between the inner tube 4 and the outer tube 5, and the outlet port 7.

A heater 8 for heating the interior of the reaction tube at a high temperature in the range of, for example, about 800 to 1200° C. is disposed so as to surround the reaction tube 3. The heater 8 comprises, as principal components, a heating wire (resistance heating element) 9 wound around the reaction tube 3 in a helical coil shape along the height of the reaction tube (vertical direction), and a cylindrical heat insulating structure 10 surrounding the helical coil of the heating wire 9. The heating wire 9 is supported by support member 11 on the inner surface of the heat insulating structure 10 so as to be able to thermally expand and contract, which support members 11 will be described later. The outer circumference of the heat insulating structure 10 is covered with an outer shell included in a cooling jacket structure, not shown. The heater 8 is mounted on the base plate 1.

A cap 12 made of, for example, a stainless steel for closing the open lower end of the manifold 2 serving as a furnace throat is supported on a lifting mechanism 13 below the manifold 2. A heat insulating tube 15 is mounted on the cap 12, and a wafer boat 14 supporting a plurality of semiconductor wafers W stacked in a horizontal position at predetermined intervals in a vertical arrangement is mounted on the heat insulating tube 15. The lifting mechanism 13 loads the wafer boat 14 into, and unloads the same from, the reaction tube, and opens and closes the cap 12. The cap 12 is provided with a rotating mechanism 16 or the like for driving the heat insulating tube 15 for rotation.

The heating wire 9 is a Fe-Cr-Al alloy wire, such as a Kanthal wire. The diameter of the heating wire 9 is dependent on the required characteristics of the reaction tube 3, i.e., a heat treatment furnace. Usually, the heating wire 9 is a Kanthal wire of about 3.5 mm in diameter.

As shown in FIG. 2, the heating wire 9 is wound in the helical coil shape having a predetermined pitch and a predetermined outside diameter smaller than the inside diameter of the heat insulating structure 10. Terminal strips 17, to be connected to electrodes extend radially through the heat insulating structure 10, project from the outer circumference of the heat insulating structure 10, and are attached to the helical coil of the heating wire 9 at appropriate axial intervals to the helical coil of the heating wire 9 to control individually the temperatures of a plurality of zones (heating zones) defined by vertically dividing the interior of the reaction tube 3, i.e., a heat treatment furnace. The terminal strips 17 are made of the same material as that of the heating wire 9 and are formed in the shape of a plate having a necessary area to prevent melting and to suppress heat radiation.

The heating wire 9 is supported on the cylindrical inner circumference of the heat insulating structure 10 by the support members 11 made of a heat-resistant, electrically insulating material, such as a ceramic material, at pitches which enables securing a predetermined quantity of heat, and with a predetermined space between the inner circumference of the heat insulating structure 10 and the outer surface of the helical coil of the heating wire 9 so as to be able to make thermal expansion and thermal contraction. As shown in FIGS. 4A and 4B, each of the support members 11 has a base portion 18 which lies on an inner side of the helical coil of the heating wire 9, and a plurality of support legs 19 which are arranged like the teeth of a comb on the base portion 18 at pitches equal to the pitch of the loops of the heating wire 9 so as to lie between the adjacent loops of the heating wire 9, and are formed integrally with the base portion 18 so that the support legs 19 project radially outward from the base portion 18. The support members 11 supports the loops of the helical coil of the heating wire 9 loosely at the predetermined pitches so as to allow the helical coil of the heating wire 9 to make thermal expansion and thermal contraction (radial and circumferential movement).

The free end portions of the support legs 19 of the support members 11 are embedded in the inner circumference of the heat insulating structure 10. Preferably, the free end portions of the support legs 19 of the support members 11 are provided with an expansion or a projection to anchor the support legs 19 firmly to the heat insulating structure 10. The support members 11 extend longitudinally in parallel to the axis of the heat insulating structure 10 and are arranged at predetermined angular intervals of, for example, 30°.

Sections of the helical coil of the heating wire 9 disposed in a vertical position corresponding to the zones are fixedly held on the heat insulating structure 10 by the terminal strips 17 and are supported on the heat insulating structure 10 by the support members 11 so as to be able to make thermal expansion and thermal contraction. Accordingly, if the heating wire 9 is elongated due to creep or thermal expansion, elongations in the sections corresponding to the zones of the helical coil of the heating wire 9 tend to be accumulated in the lower portions of the sections by gravity. Therefore, every loop or one loop out of every several loops of the helical coil of the heating wire 9 has fixing members 21 so that the heating wire 9 is anchored to the heat insulating structure 10. Thus, the fixing members 21 are used in addition to the support members 11 and the terminal strips 17 to hold the helical coil of the heating wire 9 fixedly on the heat insulating structure 10.

Preferably, the fixing members 21 are bars made of the same material as that of the heating wire 9. As shown in FIG. 3, each of the bar-shaped fixing members 21 having a predetermined length is fixed by welding or the like to an outer surface of the loop of the heating wire 9 so as to project radially outward. The free end portions of the fixing members 21 are embedded in the heat insulating structure 10 to hold fixedly the portions of each of an appropriate number of loops of the heating wire 9 on the heat insulating structure 10 so that circumferential movement of the heating wire 9 is prevented. The fixing members 21 may be regarded as fixing members or fixing legs formed integrally with the heating wire 9.

Heat generated by the heating wire 9 is dissipated outside if the fixing members 21 are excessively long or the fixing members 21 cannot be anchored to the heat insulating structure 10 by a sufficient anchoring strength if the fixing members 21 are excessively short. Therefore, it is preferable to determine the length of the fixing members 21 so that the fixing members 21 do not penetrate or extend through the heat insulating structure 10 and lie within the heat insulating structure 10. Since stress is induced in the fixing members 21, it is preferable to form the fixing members 21 in a diameter or a sectional area sufficient to withstand the stress. The fixing members 21 may be provided in their free end portions with an expansion or a projection to secure an increased anchoring strength.

Preferably, the fixing members 21 are attached to the heating wire 9 at angular positions corresponding to the support members 11. The fixing members 21 thus arranged are concealed from view by the support members 11, which improves the appearance of the heater 8. Each of the fixing members 21 of the heating wire 9 is disposed between the adjacent support legs 19 so as to extend in the same direction as the support legs 19, and the free end portion of the fixing member 21 is embedded in the heat insulating structure 10. The fixing members 21 may be arranged in the sections of the helical coil of the heating wire 9 corresponding to the zones, may be arranged in alignment with respect to a direction parallel to the axis of the cylindrical heat insulating structure 10, may be arranged at a fixed angular interval and regularly dislocated or may be regularly dislocated with respect to a circumferential direction.

A method of fabricating the heater 8 will be explained by way of example. The heating wire 9 provided with the terminal strips 17 and the fixing members 21, the support members 11, and a drum-shaped jig for supporting the support members 11 are prepared. The support members 11 are arranged on the outer circumference of the jig. The jig is rotated and the heating wire 9 is wound helically round the jig so as to extend through spaces between the support legs 19 of the support member 11.

Then, a filer element of a mesh is wound round the heating wire 9 wound on the jig so as to evade the terminal strips 17 and the support legs 19 of the support members 11, the jig is immersed in a suspension containing inorganic fibers serving as heat insulating material, and a suction is applied to the inner space of the jig to deposit the heat insulating material on the filter element. The jig immersed in the suspension is rotated to stir the suspension containing the heat insulating material and to deposit the heat insulating material on the filter element in a uniform thickness. Thus, the heat insulating structure 10 of a desired wall thickness is formed, and the free end portions of the support legs 19 of the support members 11 and the free end portions of the fixing members 21 of the heating wire 9 are embedded in the heat insulating structure 10.

Then, the jig is pulled out of the suspension, the heat insulating material deposited on the filter element is dried naturally or forcibly to complete the cylindrical heat insulating structure 10. Subsequently, the filter element and the jig are removed from the heat insulating structure 10, and the heat insulating structure 10 is subjected to a surface treatment process or the like to complete the heater 8 having the helical coil of the heating wire 9 supported on the inner circumference of the heat insulating structure 10 by the support members 11, the terminal strips 17 and the fixing members 21.

In the heat treatment apparatus thus constructed, the fixing members 21, which are provided on a suitable number of loops of the helical coil of the heating wire 9, are used in addition to the support members 11 and the terminal strips 17 to hold the helical coil of the heating wire 9 fixedly on the heat insulating structure 10. Therefore, the heating wire 9 is prevented from circumferential movement, and the accumulation of elongations in the heating wire 9 due to creep or thermal expansion in one end portion of the heat insulating wire 9 can be prevented. Consequently, the expansion of the loops of the heating wire 9 in one end of the helical coil of the heating wire 9 does not occur and contact between the loops of the helical coil of the heating wire 9 and the inner circumference of the heat insulating structure 10 can be avoided, so that deformation, such as buckling, of the heating wire 9 does not occur, the heating wire 9 will not be broken and the durability of the heating wire 9 can be improved.

Since the fixing members 21 project radially outward from the loops of the helical coil of the heating wire 9, and the free end portions of the fixing members 21 are embedded in the heat insulating structure 10, sections, each of a suitable number of loops, of the helical coil of the heating wire 9 can be easily held fixedly on the heat insulating structure 10 by a simple structure including the fixing members 21. In the vertical heat treatment apparatus, in particular, one loop out of every suitable number of loops in every section of the helical coil of the heating wire 9 corresponding to the zone is fixedly held on the heat insulating structure 10 by the fixing members 21. Therefore, the accumulation of an elongation in the heating wire 9 due to creep or thermal expansion in the lower end of the section of the helical coil of the heating wire 9 by gravity can be prevented, and hence the durability of the heating wire 9 can be improved.

The support member 11 serving also as a separator for separating the adjacent loops of the helical coil of the heating wire 9 has the base portion 18 disposed on the inner side of the helical coil of the heating wire 9, and the plurality of radial support legs 19 longitudinally arranged like the teeth of a comb on the base portion 18 at a pitch equal to the pitch of the loops of the helical coil of the heating wire 9 so as to lie between the adjacent loops of the helical coil of the heating wire 9 and formed integrally with the base portion 18, the free end portions of the support legs 19 are embedded in the heat insulating structure 10, and the fixing members 21 are arranged on the heating wire 9 at positions corresponding to the support members 11. Therefore, the fixing members 21 holding the heating wire 9 are concealed by the support members 11, which makes the appearance of the heater 8 attractive.

Figure 5:
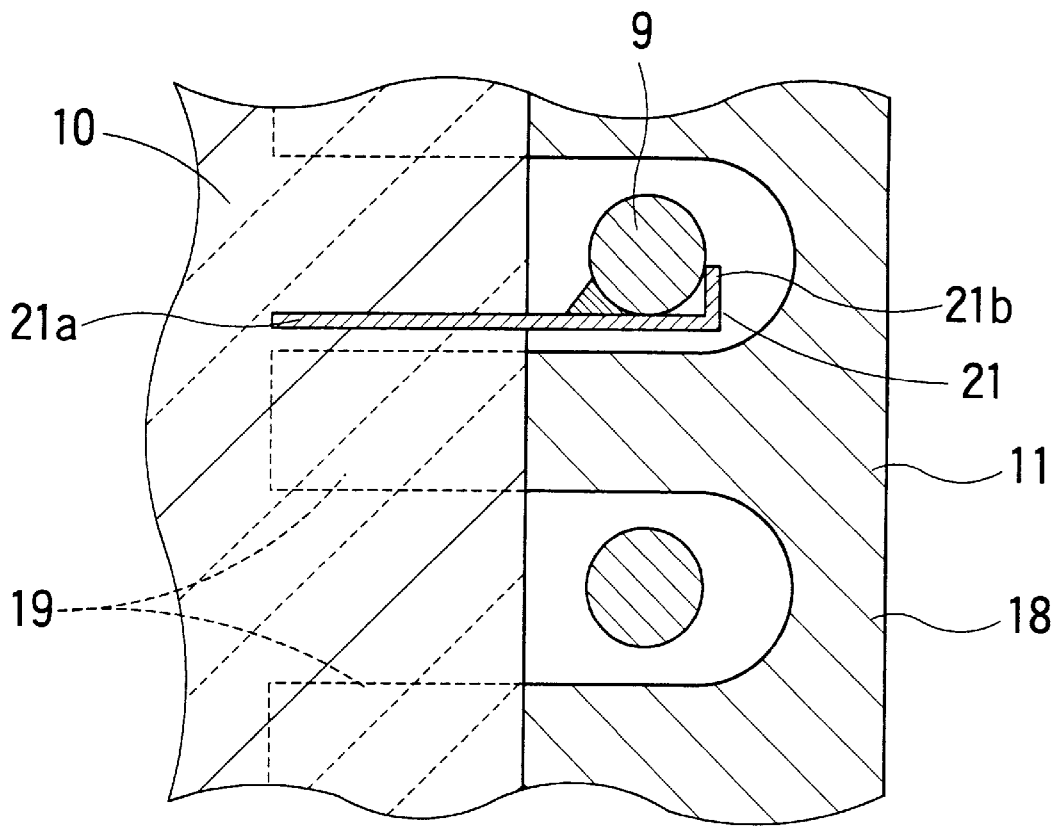
FIG. 5 is a sectional view of an essential portion of a modification of a fixing part on the heating wire.

The present invention is not limited in its practical application to the foregoing embodiment, and various modifications thereof are possible in the light of the above teachings. For example, the fixing member 21 may be a strip (plate-shaped member) 21a provided at one end thereof with a flange 21b for positioning a loop of the helical coil of the heating wire 9 as shown in FIG. 5. A fixing member 21 which fixes a loop of the helical coil of the heating wire 9 directly to the support member 11 may be used instead of the fixing member 21. It is preferable to dispose the fixing members 21 at positions corresponding to the support members 11, which, however, is not necessarily essential.

The heat treatment apparatus in accordance with the present invention is not only suitable for carrying out vacuum CVD process, but also suitable for carrying out oxidation, diffusion, annealing or the like. The present invention may be embodied in a horizontal heat treatment apparatus. The heat treatment apparatus of the present invention is suitable for processing workpieces other than semiconductor wafers, provided that the workpieces have a planar shape. For example, the heat treatment apparatus of the present invention is applicable to processing substrates for forming LCDs.

The heat treatment apparatus in the first embodiment exercises the following effects.

(1) In the heat treatment apparatus of the present invention comprising the reaction tube, the helical coil of the heating wire disposed so as to surround the reaction tube, the cylindrical heat insulating structure surrounding the helical coil of the heating wire, and the support members arranged at a predetermined pitch and supporting the helical coil of the heating wire on the inner circumference of the heat insulating structure so as to enable the helical coil of the heating wire to make thermal expansion and thermal contraction, one loop out of every suitable number of loops of the helical coil of the heating wire is fixed to the heat insulating structure by the fixing means. Therefore, the accumulation of an elongation in the heating wire due to creep or thermal expansion in one end of the helical coil of the heating wire can be prevented, which improves the durability of the heating wire.

(2) The fixing members projecting radially outward from the loops of the helical coil of the heating wire and embedded in the heat insulating structure to serve as the fixing means are simple in construction and capable of easily fixing the heating wire to the heat insulating structure.

(3) In the heat treatment apparatus comprising a cylindrical reaction tube disposed in a vertical position, the helical coil of the heating wire formed so as to surround the reaction tube, the heat insulating structure disposed so as to surround the helical coil of the heating wire, and the support members arranged at predetermined pitches on the inner circumference of the heat insulating structure and supporting the helical coil of the heating wire so as to enable the heating wire to make thermal expansion and thermal contraction, and the terminal strips attached to the sections of the helical coil of the heating wire corresponding to the plurality of zones to control the sections of the helical coil of the heating wire individually, the fixing members are attached to one loop out of every suitable number of loops in each section of the helical coil of the heating wire so as to project radially outward, and the free end portions of the fixing members are embedded in the heat insulating structure to use the fixing members for fixing the heating wire to the heat insulating structure in addition to the terminal strips and the support members. Therefore, the elongation of the heating wire due to creep or thermal expansion is stopped by the fixing members to prevent the accumulation of an elongation of the heating wire in the lower end of each section of the helical coil of the heating wire by gravity can be prevented and the durability of the heating wire can be improved.

(4) Each of the support members has the base portion disposed on the inner side of the helical coil of the heating wire, and the plurality of radial support legs longitudinally arranged like the teeth of a comb on the base portion at a pitch equal to the pitch of the loops of the helical coil of the heating wire so as to lie between the adjacent loops of the helical coil of the heating wire and formed integrally with the base portion, the free end portions of the support legs are embedded in the heat insulating structure, and the fixing members are formed at positions corresponding to the support members. Therefore, the fixing members are concealed by the support members, which makes the heater look nice.

Second Embodiment

A second embodiment of the present invention will be described with reference to FIGS. 6A to 6C. The second embodiment shown in FIGS. 6A to 6C is substantially the same as the first embodiment, except that fixing members employed in the second embodiment in holding a heating wire 9 are different from those employed in the first embodiment.

Figure 6A:
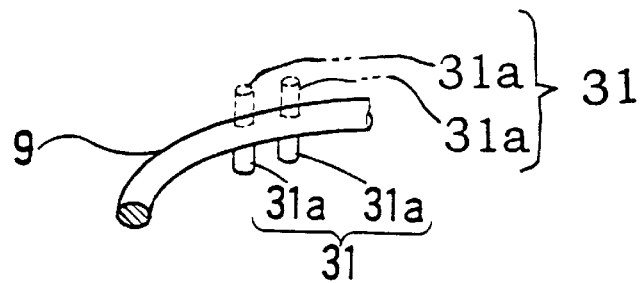
FIG. 6A is a perspective view of a fixing part on a heating wire included in a heat treatment apparatus in a second embodiment according to the present invention.
Figure 6B:
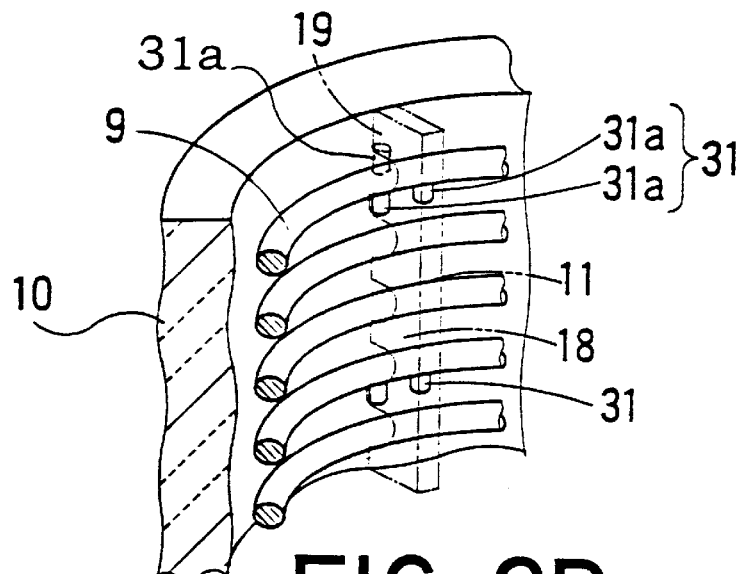
FIG. 6B is a fragmentary perspective view of the heating wire shown in FIG. 6A.
Figure 6C:
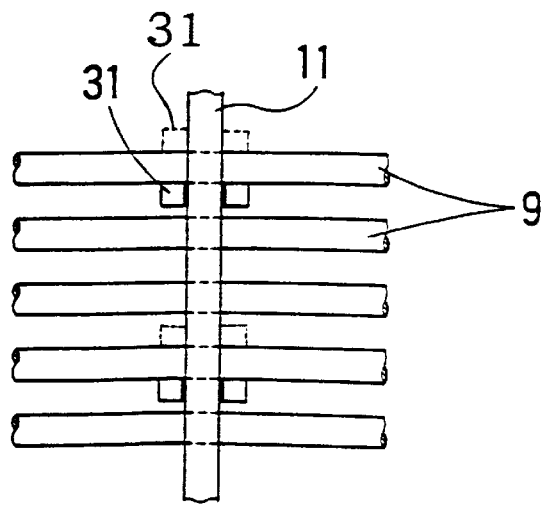
FIG. 6C is a front view of the heating wire shown in FIG. 6A.

In FIGS. 6A to 6C, parts like or corresponding to those shown in FIGS. 1 to 4 are designated by the same reference characters and the detailed description thereof will be omitted.

In FIGS. 6A to 6C, a heating wire 9 is disposed in a helical coil shape on the inner circumference of a heat insulating structure 10. The helical coil of the heating wire 9 is supported by support members 11 in a manner where the heating wire 9 can be move circumferentially and radially, each of the support member 11 having a base portion 18 and a plurality of support legs 19.

The helical coil of the heating wire 9 is provided with holding members 31, each consisting of a pair of cylindrical holding legs 31a attached to one loop out of every suitable number of loops of the heating wire 9. The holding legs 31a of each holding member 31 are fixed to the heating wire 9 so as to project downward on the opposite sides, respectively, of the support leg 19 of the support member 11 to receive the support leg 19 therebetween and thereby to prevent the heating wire 9 from circumferential movement.

Since the support leg 19 of the support member 11 is received between the pair of holding legs 21a attached to the heating wire 9, the heating wire 9 is allowed to make radial movement and is prevented from circumferential movement.

The pair of holding legs 31a may be extended upward from the heating wire 9 instead of being extended downward from the heating wire 9.

Figure 7A:
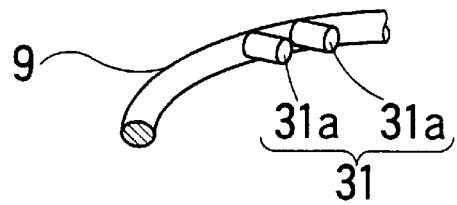
FIG. 7A is a perspective view of a fixing part on the heating wire in a modification.
Figure 7B:
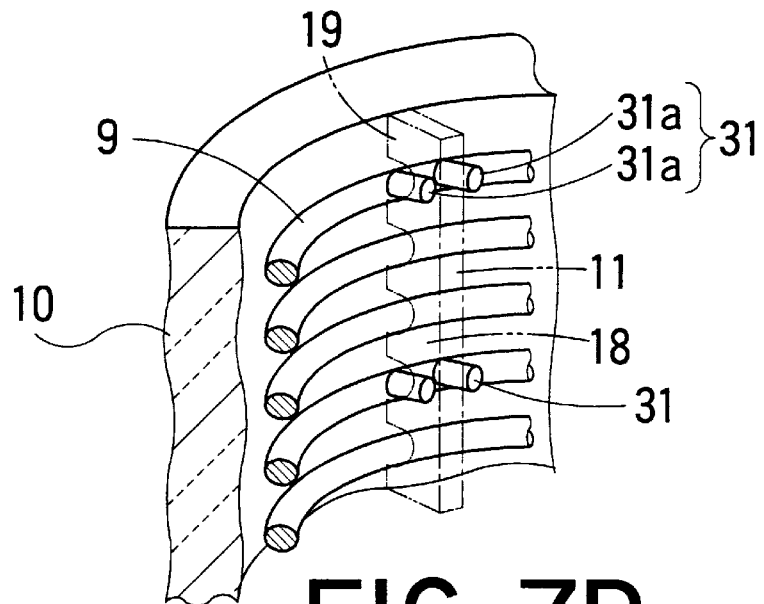
FIG. 7B is a perspective view of the heating wire shown in FIG. 7A.
Figure 7C:
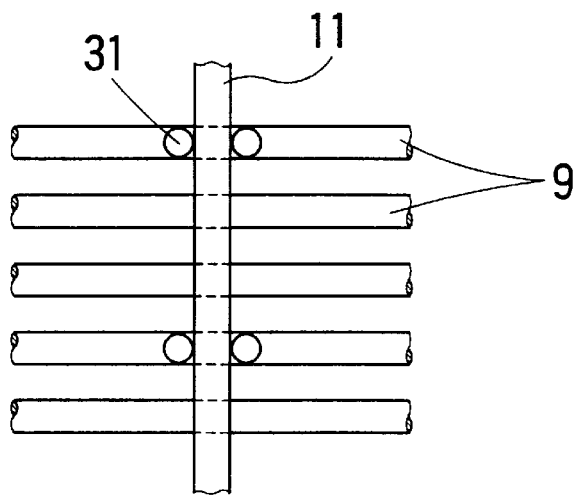
FIG. 7C is a front view of the heating wire shown in FIG. 7A.

As shown in FIGS. 7A to 7C the helical coil of the heating wire 9 may be provided with holding members 31, each consisting of a pair of cylindrical holding legs 31a attached thereto so as to project radially inward from the heating wire 9 on the opposite sides, respectively, of the base portion 18 of the support member 11 to receive the base portion 18 therebetween.

Figure 8A:
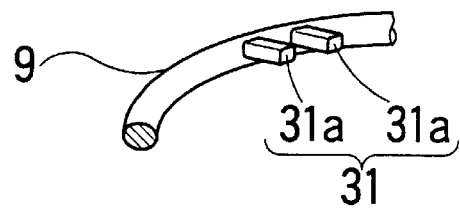
FIG. 8A is a perspective view of a fixing part on the heating wire in a modification.
Figure 8B:
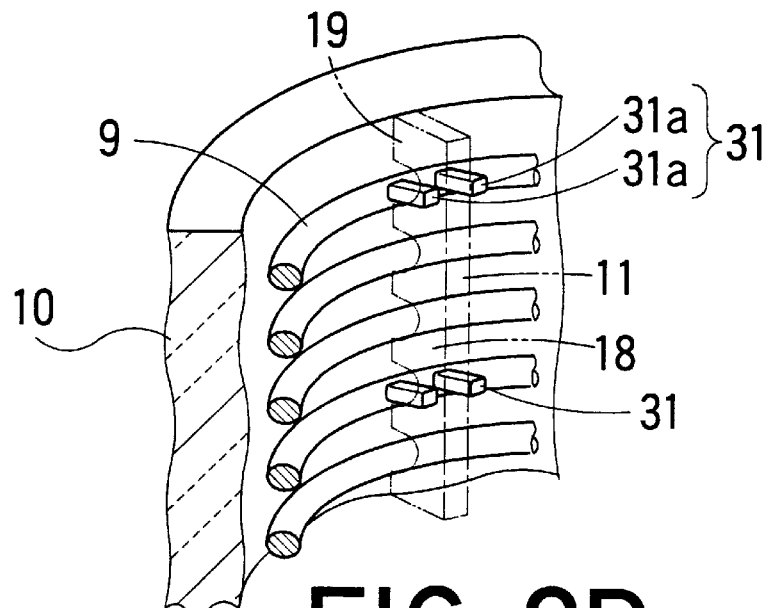
FIG. 8B is a perspective view of the heating wire shown in FIG. 8A.
Figure 8C:
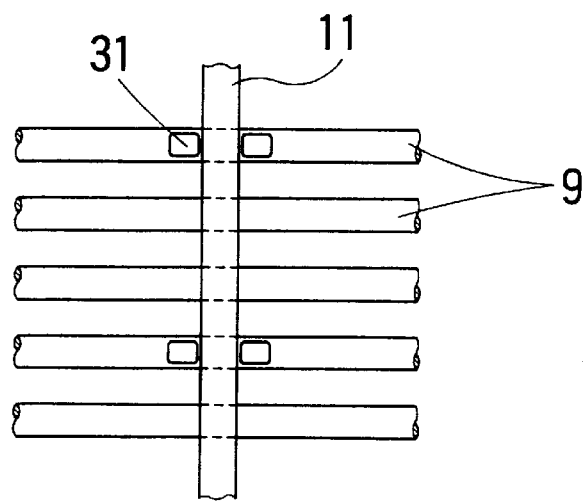
FIG. 8C is a front view of the heating wire shown in FIG. 8A.

As shown in FIGS. 8A to 8C the helical coil of the heating wire 9 may be provided with holding members 31, each consisting of a pair of holding legs 31a having the shape of a quadrangular prism and attached thereto so as to project radially inward from the heating wire 9 on the opposite sides, respectively, of the base portion 18 of the support member 11 to receive the base portion 18 therebetween.

What is claimed is:

1. A heat treatment apparatus comprising:

a cylindrical reaction tube disposed in a vertical position;

a heat insulating structure disposed so as to surround the reaction tube;

a heating wire in a helical coil shape disposed on an inner circumference of the heat insulating structure;

support members held on the heat insulating structure and supporting the heating wire so as to allow the heating wire to make thermal expansion and thermal contraction; and terminal strips extending from the heating wire and penetrating the heat insulating structure, and wherein the heating wire is provided with a plurality of fixing means extending from said heating wire, said fixing means being independent of said terminal strips and having free ends, the fixing means being embedded in the heat insulating structure so that the free ends of the fixing means remain within the insulating structure to avoid circumferential movement of the heating wire.

2. The heat treatment apparatus according to claim 1, wherein the fixing means are bar-shaped members projecting radially outward from the heating wire.

3. The heat treatment apparatus according to claim 1, wherein the fixing means are plate-shaped members, each projecting radially outward from the heating wire and provided with a flange at an inner end thereof attached to the heating wire.

4. The heat treatment apparatus according to claim 1, wherein each of the support members has a base portion to be disposed in a vertical position on an inner side of the heating wire, and a plurality of support legs projecting radially outward from the base portion and embedded in the heat insulating structure.

5. A heat treatment apparatus comprising:

a cylindrical reaction tube disposed in a vertical position;

a heat insulating structure disposed so as to surround the reaction tube;

a heating wire in a helical coil shape disposed on the inner circumference of the heat insulating structure; and support members held on the heat insulating structure and supporting the heating wire so as to allow the heating wire to make thermal expansion and thermal contraction;

wherein the heating wire is provided with a plurality of fixing means, said fixing means being positioned on said heating wire and in contact with the support members to avoid circumferential movement of the heating wire.

6. The heat treatment apparatus according to claim 5, wherein each of the support members has a base portion to be disposed in a vertical position on an inner side of the heating wire, and a plurality of support legs projecting radially outward from the base portion and embedded in the heat insulating structure, and the fixing means are engaged with the base portion or the support legs.

7. The heat treatment apparatus according to claim 6, wherein each of the fixing means has a pair of fixing legs projecting radially inward from the heating wire, and the pair of fixing legs are engaged with the base portion.

8. The heat treatment apparatus according to claim 6, wherein each of the fixing means has a pair of fixing legs projecting upward from the heating wire, and the pair of fixing legs is engaged with a corresponding support leg.

9. The heat treatment apparatus according to claim 6, wherein each of the fixing means has a pair of fixing legs projecting downward from the heating wire, and the pair of fixing legs is engaged with a corresponding support leg.

10. A heat treatment apparatus, comprising:

a reaction tube;

a heat insulating structure disposed so as to surround said reaction tube;

a heating element in a helical coil shape disposed internally of said heat insulating structure;

support members supported by said heat insulating material and positioned so as to support said heating element while allowing said heating element to thermally expand and thermally contract;

terminals for electrode connection, said terminals extending from said heating element and radially out through said heat insulating structure; and a fixing member extending from said heating element at a different location on said heating element than said terminals, said fixing member being positioned for contact with a relatively fixed in position support structure to help prevent circumferential movement of said heating coil, which support structure is one of said support members or said heat insulating structure.

11. A heat treatment apparatus as recited in claim 10 wherein said fixing member extends radial out partially through said heat insulating structure so as be embedded in said heat insulating structure.

12. A heat treatment apparatus as recited in claim 10 wherein there are a plurality of fixing members extending from said heating element.

13. A heat treatment apparatus as recited in claim 12 wherein a pair of spaced apart fixing members are spaced apart so as to be on circumferentially opposite sides of one of said support members and in position to prevent circumferential movement due to contact with said one of said support members.

14. A heat treatment apparatus as recited in claim 13 wherein said heat treatment apparatus is a vertical heat treatment apparatus and said pair of spaced apart fixing members extend vertically off said heating element and are spaced inward of an interior surface of said heat insulating structure.

15. A heat treatment apparatus as recited in claim 13 wherein said heat treatment apparatus is a vertical heat treatment apparatus and said pair of spaced apart fixing members extend radially inward away from an interior surface of said heat insulating structure.

16. A heat treatment apparatus as recited in claim 10 wherein said support members each have an interior base portion and a plurality of spaced apart support legs which extend radially out from said base portion so as to be embedded in said heat insulating structure and which support legs are spaced apart along an extension of said interior base portion to define a plurality of heating element reception slots through which said helical coil shaped heating element extends, and wherein said slots are formed with a sufficient amount of clearance with respect to said heating element extending therethrough so as to support said heating element loosely and allow for radial expansion and contraction.

17. A heat treatment apparatus as recited in claim 16 wherein said fixing member extends radial out from said heating coil into an embedded relationship with said heat insulating structure and at a location on said heating coil which coincides with a slot in said support member such that a respective one of said support members conceals said fixing member.

18. A heat treatment apparatus as recited in claim 16 wherein there are a pair of fixing members attached to said heating element so as to be circumferentially spaced apart on opposite sides and in contact with one of said support members.

19. A heat treatment apparatus as recited in claim 10 wherein there are a plurality of fixing members extending from said heating element into an embedded relationship with respect to said heat insulating structure, and said heating element is a coiled resistance wire and said terminals are attached to said coiled resistance wire and extend radially though and out away from an exterior surface of said heat insulating structure, and said terminals being embedded in said heat insulating structure to support said coiled resistance wire in combination with said fixing members.

20. A heat treatment apparatus as recited in claim 19 wherein said heat treatment apparatus comprises a plurality of coiled resistance wire units with each having a pair of terminals extending through said heat insulating structure and each having a plurality of fixing members independent of said terminals.

* * * * *